United States Patent
Murali et al.

(10) Patent No.: US 8,896,035 B2
(45) Date of Patent: Nov. 25, 2014

(54) FIELD EFFECT TRANSISTOR HAVING PHASE TRANSITION MATERIAL INCORPORATED INTO ONE OR MORE COMPONENTS FOR REDUCED LEAKAGE CURRENT

(71) Applicant: International Business Machines Corporation, Armonk, NY (US)

(72) Inventors: Kota V. R. M. Murali, Bangalore (IN); Edward J. Nowak, Essex Junction, VT (US); Stuart P. Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 13/656,819

(22) Filed: Oct. 22, 2012

(65) Prior Publication Data

US 2014/0110765 A1   Apr. 24, 2014

(51) Int. Cl.
  *H01L 29/76* (2006.01)
(52) U.S. Cl.
  USPC ......................................................... 257/288
(58) Field of Classification Search
  CPC .................................................. H01L 29/6659
  USPC ......................................................... 257/288
  See application file for complete search history.

(56) References Cited

U.S. PATENT DOCUMENTS

| | | | |
|---|---|---|---|
| 6,610,576 B2 | 8/2003 | Nowak | |
| 6,630,720 B1 | 10/2003 | Maszara et al. | |
| 7,005,665 B2 * | 2/2006 | Furkay et al. | 257/2 |
| 7,247,919 B1 | 7/2007 | Mouli et al. | |
| 7,408,217 B2 | 8/2008 | Yoon et al. | |
| 7,824,986 B2 | 11/2010 | Gurtej et al. | |
| 8,110,465 B2 | 2/2012 | Zhu et al. | |
| 2004/0137689 A1 | 7/2004 | Dokumaci et al. | |
| 2005/0208699 A1 * | 9/2005 | Furkay et al. | 438/102 |
| 2007/0166832 A1 * | 7/2007 | Tilak et al. | 436/151 |

(Continued)

OTHER PUBLICATIONS

Changhyun Ko, Zheng Yang, and Shriram Ramanathan; "Work Function of Vanadium Dioxide Thin Films Across the Metal-Insulator Transition and the Role of Surface Nonstoichiometry"; School of Engineering and Applied Sciences, Harvard University, Cambridge, Massachusetts 02138, United States; Published: Aug. 9, 2011.*

(Continued)

*Primary Examiner* — Jarrett Stark
*Assistant Examiner* — Mohammad M Hoque
(74) *Attorney, Agent, or Firm* — Gibb & Riley, LLC; Michael J. LeStrange, Esq.

(57) ABSTRACT

Disclosed is a metal oxide semiconductor field effect transistor (MOSFET) having phase transition material incorporated into one or more components and an associated method. The MOSFET can comprise an asymmetric gate electrode having a phase transition material section (e.g., a chromium or titanium-doped vanadium dioxide ($VO_2$) section) above the drain-side of the channel region. Additionally or alternatively, the MOSFET can comprise source and drain contact landing pads comprising different phase transition materials (e.g., un-doped $VO_2$ and chromium or titanium-doped $VO_2$, respectively). In any case, the phase transition material(s) are preselected so as to be insulative when the MOSFET is in the OFF state and the voltage difference between the drain region and the source region ($V_{DS}$) is high in order to minimize leakage current and so as to be conductive when the MOSFET is in the ON state and $V_{DS}$ is high in order to maintain drive current.

10 Claims, 13 Drawing Sheets

(56) References Cited

U.S. PATENT DOCUMENTS

| | | | |
|---|---|---|---|
| 2008/0308870 A1* | 12/2008 | Faul et al. | 257/368 |
| 2009/0032889 A1 | 2/2009 | Zhu et al. | |
| 2011/0254613 A1 | 10/2011 | Kim et al. | |
| 2012/0286743 A1* | 11/2012 | Soltani et al. | 320/166 |

OTHER PUBLICATIONS

Yang, et al., "Oxide Electronics Utilizing Ultrafast Metal-Insulator Transitions," Reviews in Advances, MR41CH08-Ramanathan, ARI, Mar. 30, 2011, pp. 337-367.

Chudnovskiy, et al., "Switching Device Based on First-Order Metal-Insulator Transistion Induced by External Electric Field," Future Trends in Microelectronics: The Nano Millennium, 2002, pp. 148-155.

Ha, et al., "Electrically-Driven Metal-Insulator Transition With Tunable Threshold Voltage in a VO2-SmNiO3 Heterostructure on Silicon," Journal of Applied Physics 110, 2011, 4 pages.

Ruzmetov, et al., "Three-Terminal Field Effect Devices Utilizing Thin Film Vanadium Oxide As the Channel Layer," Journal of Applied Physics 107, 2010, 8 pages.

Sengupta, et al., "Field-Effect Modulation of Conductance in VO2 Nanobeam Transistors With HfO2 As the Gate Dielectric," Applied Physics, Letters 99, 2011, 3 pages.

Golan, et al., "Investigation of Phase Transistion Mechanism in Vanadium Oxide Thin Films," Journal of Optoelectronics and Advance Materials, vol. 6, No. 1, Mar. 2004, pp. 189-195.

* cited by examiner

FIELD EFFECT TRANSISTOR HAVING PHASE TRANSITION MATERIAL INCORPORATED INTO ONE OR MORE COMPONENTS FOR REDUCED LEAKAGE CURRENT

BACKGROUND

1. Field of the Invention

The embodiments disclosed herein are related to metal oxide semiconductor field effect transistors (MOSFETs) and, more particularly, to a MOSFET structure having phase transition material incorporated into one or more components in order to minimize leakage current, such as Gate-Induced Drain Leakage (GIDL), when the MOSFET is in its OFF state.

2. Description of the Related Art

In metal oxide semiconductor field effect transistors (MOSFETs), Gate-Induced Drain Leakage (GIDL) often places a lower bound on leakage and/or gate dielectric thickness for low-power designs. GIDL refers to the high electric field and, particularly, the band-to-hand tunneling that occurs at the channel region to drain region interface overlapped by the gate structure, when the MOSFET is in an OFF state and when the drain region is close to the power-supply voltage such that the voltage difference between the drain region and the source region ($V_{DS}$) is relatively high. To minimize GIDL, MOSFETs are often designed such that the gate structure does not or only minimally overlaps the interface and/or with a relatively thick gate dielectric layer. However, both solutions tend to lower drive current, thereby result in reduced circuit speed when the MOSFET is in the ON state. Therefore, there is a need in the art for a MOSFET structure and method of forming the structure that avoids or at least minimizes leakage current, such as GIDL, when the MOSFET is in the OFF state, without compromising the drive current required to maintain a desired circuit speed, when the MOSFET is in the ON state.

SUMMARY

In view of the foregoing, disclosed herein are embodiments of a metal oxide semiconductor field effect transistor (MOSFET) having phase transition material incorporated into one or more components (e.g., an asymmetric gate structure and/or into source and drain contact landing pads) in order to minimize leakage current, such as Gate-Induced Drain Leakage (GIDL), when the MOSFET is in its OFF state, without compromising the drive current required to maintain a desired circuit speed, when the MOSFET is in its ON state. Specifically, the MOSFET can comprise an asymmetric gate structure with a gate electrode having a first section above the source-side of the channel region and a second section above the drain-side of the channel region. The second section can comprise a phase transition material (e.g., doped vanadium dioxide ($VO_2$), such as chromium or titanium-doped vanadium dioxide ($VO_2$)). Additionally or alternatively, the MOSFET can comprise a source and drain contact landing pads comprising different phase transition materials (e.g., un-doped vanadium dioxide ($VO_2$) and doped vanadium dioxide ($VO_2$), respectively). In any case, the phase transition material(s) can be pre-selected so as to be insulative particularly when the MOSFET is in the OFF state and the voltage difference between the drain region and the source region ($V_{DS}$) is high in order to minimize GIDL and so as to be conductive particularly when the MOSFET is in the ON state and $V_{DS}$ is high in order to maintain drive current. Also disclosed herein are method embodiments for forming the above-described MOSFET embodiments.

More particularly, disclosed herein is an embodiment of a metal oxide semiconductor field effect transistor (MOSFET) with an asymmetric gate structure having a gate electrode with a phase transition material section designed to minimize leakage current, such as Gate-Induced Drain Leakage (GIDL), when the MOSFET is in its OFF state, without compromising the drive current, when the MOSFET is in its ON state. Specifically, the MOSFET can comprise a semiconductor body and the semiconductor body can comprise at least a channel region, a source region adjacent to a first side of the channel region, and a drain region adjacent to a second side of the channel region opposite the first side. The MOSFET can further comprise an asymmetric gate structure on the semiconductor body adjacent to the channel region. This asymmetric gate structure can comprise a gate electrode having a first section above the first side of the channel region (i.e., above the source-side of the channel region) and a second section above the second side of the channel region (i.e., above the drain-side of the channel region). The first section can comprise a conventional gate conductor material (e.g., a doped polysilicon or metal gate conductor material). The second section can be different from the first section and specifically can comprise a phase transition material (e.g., doped vanadium oxide). The phase transition material can be pre-selected in order to ensure that it is insulative when a voltage difference between the drain region and the source region is above a threshold difference and when the field effect transistor is in an OFF state and in order to ensure that it is conductive when the voltage difference between the drain region and the source region is above the threshold difference and when the field effect transistor is in an ON state. Optionally, this MOSFET can further comprise contact landing pads, which are on the source region and the drain region and which comprise different phase transition materials (e.g., un-doped vanadium dioxide ($VO_2$) and doped vanadium dioxide ($VO_2$), respectively) such that they are similarly insulative when a voltage difference between the drain region and the source region is above a threshold difference and when the field effect transistor is in an OFF state and conductive when the voltage difference between the drain region and the source region is above the threshold difference and when the field effect transistor is in an ON state.

Also disclosed herein is an embodiment of a method of forming the above-described MOSFET. Specifically, the method can comprise providing a semiconductor body. The method can further comprise forming an asymmetric gate structure on the semiconductor body adjacent to a channel region. Specifically, the asymmetric gate structure can be formed such that it comprises a gate electrode with a first section above a first side of the channel region adjacent to a source region (i.e., above a source-side of the channel region) and a second section above a second side of the channel region adjacent to a drain region (i.e., above a drain-side of the channel region). The first section can be formed so that it comprises a conventional gate conductor material (e.g., a doped polysilicon or metal gate conductor material). The second section can be formed so that it is different from the first section and specifically so that it comprises a phase transition material (e.g., doped vanadium dioxide ($VO_2$), such as chromium or titanium-doped vanadium dioxide ($VO_2$)). The phase transition material can be pre-selected in order to ensure that it is insulative when a voltage difference between the drain region and the source region is above a threshold difference and when the field effect transistor is in an OFF state and in order to ensure that it is conductive when the voltage difference between the drain region and the source region is above the threshold difference and when the field effect transistor is in an ON state. Optionally, this method can further comprise forming contact landing pads on the semiconductor body adjacent to the source region and drain region such that the contact landing pads comprise different phase transition materials (e.g., un-doped vanadium oxide and doped vanadium dioxide ($VO_2$), respectively), thereby making them similarly insulative when a voltage difference between the drain region and the source region is above a threshold difference and when the field effect transistor is in an OFF state and conductive when the voltage difference between the drain region and the source region is above the threshold difference and when the field effect transistor is in an ON state.

Also disclosed herein is an embodiment of a metal oxide semiconductor field effect transistor (MOSFET) with source and drain contact landing pads that comprise different phase transition materials and that are designed to minimize current leakage, such as Gate-Induced Drain Leakage (GIDL), when the MOSFET is in its OFF state, without compromising the drive current, when the MOSFET is in its ON state. Specifically, the MOSFET can comprise a semiconductor body and the semiconductor body can comprise at least a channel region, a source region adjacent to a first side of the channel region, and a drain region adjacent to a second side of the channel region opposite the first side. The MOSFET can further comprise a gate structure on the semiconductor body adjacent to the channel region. Optionally, the gate structure can comprise an asymmetric gate structure, as described above. Additionally, the MOSFET can comprise a first contact landing pad on the semiconductor body adjacent to the source region and a second contact landing pad on the semiconductor body adjacent to the drain region. The first contact landing pad can comprise a first phase transition material (e.g., un-doped vanadium dioxide ($VO_2$)) and the second contact landing pad can comprise a second phase transition material (e.g., doped vanadium dioxide ($VO_2$), such as chromium or titanium-doped vanadium dioxide ($VO_2$)) different from the first phase transition material. The first and second phase transition materials can be pre-selected in order to ensure that they are both insulative when a voltage difference between the drain region and the source region is above a threshold difference and when the field effect transistor is in an OFF state and in order to ensure that they are both conductive when the voltage difference between the drain region and the source region is above the threshold difference and when the field effect transistor is in an ON state.

Also disclosed herein is an embodiment of a method of forming the above-described MOSFET. Specifically, the method can comprise providing a semiconductor body. The method can further comprise forming a gate structure on the semiconductor body adjacent to a channel region. Optionally, the gate structure can be formed such that it is asymmetric, as described above. Additionally, the method can comprise forming contact landing pads, which comprise a phase transition material, on the semiconductor body adjacent to a source region and to a drain region. Specifically, a first contact landing pad comprising a first phase transition material (e.g., un-doped vanadium dioxide ($VO_2$)) can be formed on the semiconductor body adjacent to the source region and a second contact landing pad comprising a second phase transition material (e.g., doped vanadium dioxide ($VO_2$), such as chromium or titanium-doped vanadium dioxide ($VO_2$)) that is different from the first phase transition material can be formed on the semiconductor body adjacent to the drain region. The first and second phase transition materials can be pre-selected in order to ensure that they are both insulative when a voltage difference between the drain region and the source region is above a threshold difference and when the field effect transistor is in an OFF state and in order to ensure that they are both conductive when the voltage difference between the drain region and the source region is above the threshold difference and when the field effect transistor is in an ON state.

BRIEF DESCRIPTION OF THE DRAWINGS

The embodiments herein will be better understood from the following detailed description with reference to the drawings, which are not necessarily drawn to scale and in which.

DETAILED DESCRIPTION

As discussed above, with metal oxide semiconductor field effect transistors (MOSFETs), Gate-Induced Drain Leakage (GIDL) often places a lower bound on leakage and/or gate dielectric thickness for low-power designs. GIDL refers to the high electric field and, particularly, the band-to-band tunneling that occurs at the channel region to drain region interface overlapped by the gate structure, when the MOSFET is in an OFF state and when the drain region is close to the power-supply voltage such that the voltage difference between the drain region and the source region ($V_{DS}$) is relatively high. To minimize GIDL, MOSFETs are often designed such that the gate structure does not or only minimally overlaps the interface and/or with a relatively thick gate dielectric layer. However, both solutions tend to lower drive current, thereby result in reduced circuit speed when the MOSFET is in the ON state.

In view of the foregoing, disclosed herein are embodiments of a metal oxide semiconductor field effect transistor (MOSFET) having phase transition material incorporated into one or more components (e.g., an asymmetric gate structure and/or into source and drain contact landing pads) in order to minimize leakage current, such as Gate-Induced Drain Leakage (GIDL), when the MOSFET is in its OFF state, without compromising the drive current required to maintain a desired circuit speed, when the MOSFET is in its ON state. Specifically, the MOSFET can comprise an asymmetric gate structure with a gate electrode having a first section above the source-side of the channel region and a second section above the drain-side of the channel region. The second section can comprise a phase transition material (e.g., doped vanadium dioxide ($VO_2$), such as chromium or titanium-doped vanadium dioxide ($VO_2$)). Additionally or alternatively, the MOSFET can comprise source and drain contact landing pads comprising different phase transition materials (e.g., un-doped vanadium dioxide ($VO_2$) and doped vanadium dioxide ($VO_2$), respectively). In any case, the phase transition material(s) can be pre-selected so as to be insulative particularly when the MOSFET is in the OFF state and the voltage difference between the drain region and the source region ($V_{DS}$) is high in order to minimize GIDL and so as to be conductive particularly when the MOSFET is in the ON state and $V_{DS}$ is high in order to maintain drive current. Also disclosed herein are method embodiments for forming the above-described MOSFET embodiments.

Figure 1:
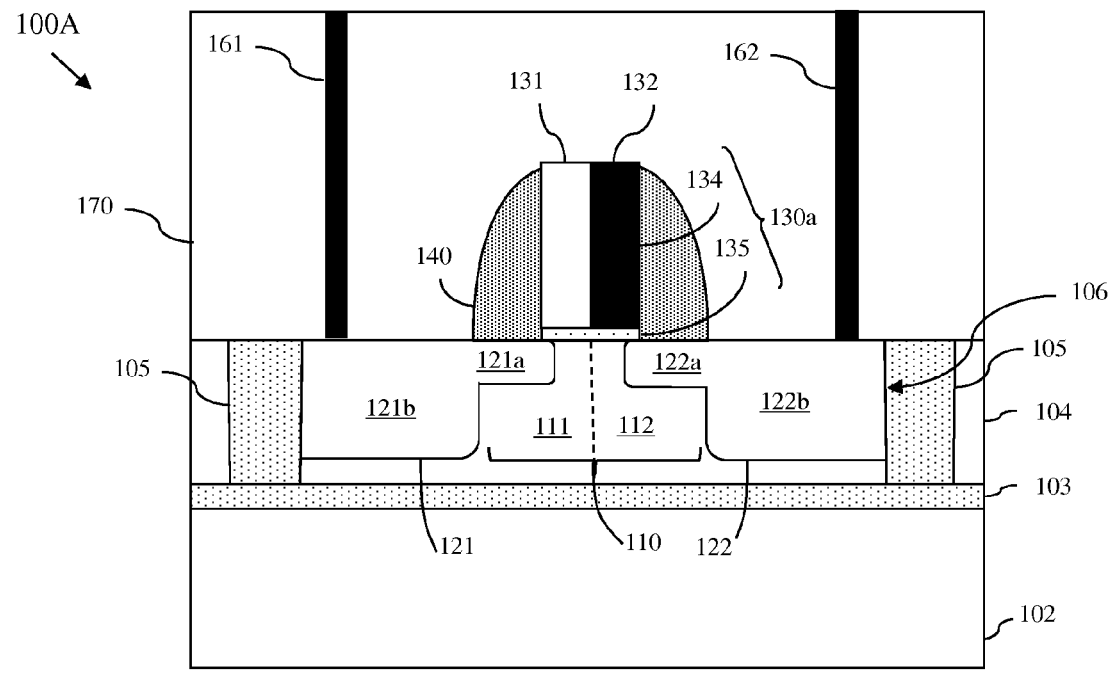
FIG. 1 is a cross-section diagram illustrating an embodiment of a metal oxide semiconductor field effect transistor.
Figure 2:
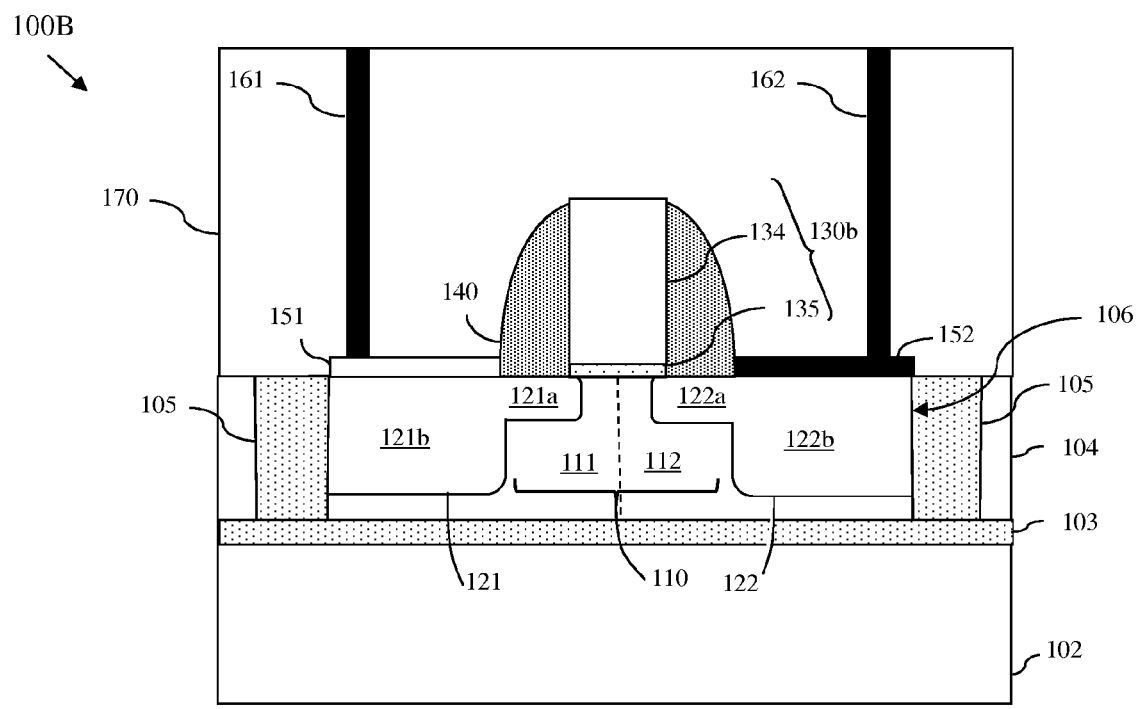
FIG. 2 is a cross-section diagram illustrating another embodiment of a metal oxide semiconductor field effect transistor.
Figure 3:
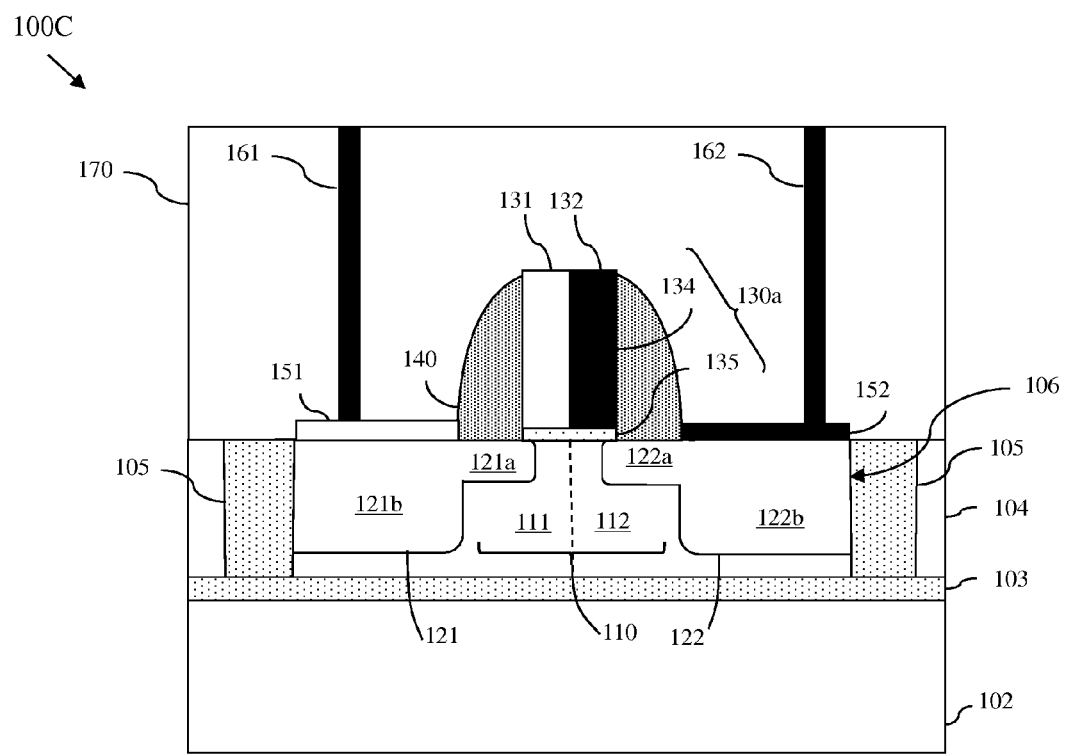
FIG. 3 is a cross-section diagram illustrating yet another embodiment of a metal oxide semiconductor field effect transistor.

More particularly, referring to FIGS. 1, 2 and 3, disclosed herein are embodiments of a metal oxide semiconductor field effect transistor (MOSFET) 100A, 100B, and 100C, respectively, each of which have phase transition material(s) incorporated into one or more components (e.g., into an asymmetric gate structure and/or into source and drain contact landing pads) in order to minimize leakage current, such as Gate-Induced Drain Leakage (GIDL), when the MOSFET is in its OFF state, without compromising the drive current required to maintain a desired circuit speed, when the MOSFET is in its ON state. It should be noted that in the structure and method embodiments described herein, the OFF state of a MOSFET refers to that state when the voltage difference between the gate structure and the source region (i.e., when $V_{GS}$) is less than the threshold voltage $V_T$ of the MOSFET, whereas the ON state of a MOSFET refers to that state when the $V_{GS}$ is less than or equal to the $V_T$.

Specifically, in each of the embodiments, the MOSFET 100A, 100B, 100C can comprise a semiconductor body 106 (e.g., an essentially rectangular shaped semiconductor body). As illustrated, this semiconductor body 106 can comprise a portion of a semiconductor layer of a semiconductor-on-insulator (SOI) wafer. Such an SOI wafer can comprise a semiconductor substrate 102 (e.g., a silicon substrate or other semiconductor substrate), an insulator layer 103 (e.g., a silicon oxide layer or other suitable insulator layer) on the substrate 102 and a semiconductor layer 104 (e.g., a single crystalline silicon layer, a single crystalline gallium nitride layer or other suitable semiconductor layer) on the insulator layer 103. The portion of the semiconductor layer that makes up the semiconductor body 106 can be defined, for example, by a trench isolation region 105. This trench isolation region 105 can, for example, comprise a conventional shallow trench isolation (STI) structure comprising a trench extending vertically through the semiconductor layer to the insulator layer 103 and filled with one or more isolation materials (e.g., a silicon oxide, silicon nitride, silicon oxynitride, etc.). Alternatively, the semiconductor body 106 can comprise a portion, as defined by a trench isolation region 105, of a bulk semiconductor wafer (e.g., a bulk single crystalline silicon wafer) or any other suitable wafer (e.g., a hybrid orientation (HOT) wafer) (not shown). Alternatively, the semiconductor body 106 can comprise a fin-shaped semiconductor body for a non-planar, multi-gate, MOSFET (e.g., a dual-gate MOSFET or a tri-gate MOSFET) (not shown).

In each of the embodiments, the semiconductor body 106 can comprise at least a channel region 110, a source region 121 adjacent to a first side 111 of the channel region 110, and a drain region 122 adjacent to a second side 112 of the channel region 110 opposite the first side 111.

Those skilled in the art will recognize that the conductivity types of the channel region 110, the source region 121 and the drain region 122 may vary depending upon the conductivity type of the MOSFET 100A, 100B, 100C and the type of semiconductor material used. For example, for an N-type MOSFET, the source region 121 and the drain region 122 can have an N-type conductivity and the channel region 110 can have either a P-type conductivity or an N-type conductivity at a lower conductivity level. However, for a PFET the reverse can be true. That is, for a PFET, the source region 121 and the drain region 122 can have a P-type conductivity and the channel region 110 can have either an N-type conductivity or a P-type conductivity at a lower conductivity level. Additionally, those skilled in the art will recognize that the different dopants can be used to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si). Those skilled in the art will recognize that different conductivity levels can be achieved using different dopant concentrations.

In each of the embodiments, the source region 121 can comprise a relatively deep source region 121b and, optionally, a shallow source extension region 121a that is positioned laterally between the deep source region 121b and the channel region 110. Similarly, the drain region 122 can comprise a relatively deep drain region 122b and, optionally, a shallow drain extension region 122a that is positioned laterally between the deep drain region 122b and the channel region 110. The shallow source and drain extension regions 121a, 122a can, optionally, have the same conductivity type but at a lower conductivity level than the deep source and drain regions 121b, 122b. The shallow source and drain extension regions 121a, 122a can be symmetrical, as illustrated, or, alternatively, can be asymmetrical (e.g., the shallow drain extension region may be relatively long as compared to the source extension region).

In each of the embodiments, the MOSFET 100A, 100C, 100B can further comprise a gate structure (see gate structure 130a of FIGS. 1 and 3 and gate structure 130b of FIG. 2) on the semiconductor body 106 adjacent to channel region 110 (i.e., extending from the source region 121 to the drain region 122). In a planar MOSFET, the gate structure can be positioned on the top surface of the semiconductor body 106, as illustrated. However, those skilled in the art will recognize that in a non-planar, multi-gate, MOSFET, the gate structure can further be positioned adjacent to opposing sides of the semiconductor body 106 (not shown). In any case, the gate structure can comprise a gate dielectric layer 135 immediately adjacent to the surface of the semiconductor body 106 and a gate electrode 134 (i.e., a gate conductor layer) on the gate dielectric layer 135. The gate dielectric layer 135 can comprise a gate oxide layer (e.g., a silicon dioxide (SiO$_2$) layer), a high-k gate dielectric layer or any other suitable gate dielectric layer. As discussed in detail below, the configuration of the gate electrode 135 may vary depending upon the embodiment. Optionally, the gate structure can overlap the source region 121 and drain region 122 and, particularly, can overlap the shallow source extension region 121a and the shallow drain extension region 122a (i.e., can extend laterally across the surface of the semiconductor body such that it is adjacent to portions of the shallow source and drain extension regions 121a, 122a immediately adjacent to the channel region 110).

In each of the embodiments, the MOSFET 100A, 100C, 100B can further comprise gate sidewall spacers 140 positioned on opposing sides of the gate structure (e.g., above the shallow source and drain extension regions 121a and 122a). The gate sidewall spacers 140 can comprise, for example, nitride sidewall spacers, oxide sidewall spacers, oxynitride sidewall spacers or other suitable dielectric spacers.

Referring to FIG. 1, in one embodiment of the metal oxide semiconductor field effect transistor (MOSFET) 100A, the gate structure 130a can be asymmetric and, particularly, can comprise a gate electrode 134 that has a phase transition material section 132 designed to minimize leakage current, such as Gate-Induced Drain Leakage (GIDL), when the MOSFET 100A is in its OFF state, without compromising the drive current, when the MOSFET 100A is in its ON state. Specifically, in the MOSFET 100A of FIG. 1, the asymmetric gate structure 130a can comprise a gate electrode 134 having a first section 131 and a second section 132 positioned laterally adjacent to the first section 131. The first section 131 can be above the first side 111 of the channel region 110, which is adjacent to the source region 121 (i.e., can be above the source-side of the channel region 110). The second section 132 can be above the second side 112 of the channel region 110, which is adjacent to the drain region 122 (i.e., can be above the drain-side of the channel region 110). The first and second sections 131, 132 of the gate electrode 134 can be approximately equal in size, as illustrated, such that the interface between the two sections 131, 132 is above the center point of the channel region 110 (i.e., approximately equidistance between the shallow source extension region 121a and the shallow drain extension region 122a). Alternatively, the second section 132 may be smaller in size than the first section 131 such that the interface between the two sections 131,132 of the gate electrode 134 is closer to the shallow drain extension region 122a than the shallow source extension region 121a (not shown).

The first section 131 of the gate electrode 134 can comprise a conventional gate conductor material. For example, the first section 131 can comprise a doped polysilicon material (e.g., an N-type polysilicon in the case of an N-type MOSFET or a P-type polysilicon in the case of a P-type MOSFET). Alternatively, the first section 131 can comprise a metal or metal alloy material (e.g., an N-type metal or N-type metal alloy in the case of an N-type MOSFET or a P-type metal or P-type metal alloy in the case of a P-type MOSFET).

It should be noted that, for the purposes of this disclosure, N-type metals or metal alloys are defined as near conduction band metals or metal alloys. Exemplary N-type metals or metal alloys include, but are not limited to, titanium nitride, titanium silicon nitride, tantalum nitride, tantalum silicon nitride, aluminum, silver, hafnium, etc. Contrarily, P-type metals or metal alloys are defined as near valence band metals or metal alloys. Exemplary P-type metals or metal alloys include, but are not limited to, rhenium, rhenium oxide, platinum, ruthenium, ruthenium oxide, nickel, palladium, iridium, etc.

The second section 132 of the gate electrode 134 can be different from the first section 131 and, specifically, can comprise a phase transition material.

For purposes of this disclosure, a phase transition material (also referred to herein as a phase change material or smart material) is a material that undergoes a phase transition as a function of a change in a local environmental condition (e.g., a change in an electric field, a change in temperature, or a change in some other environmental condition) and, thus, undergoes a corresponding local environmental condition-dependent change in an electrical property, such as resistance. For example, some phase transition materials (e.g., doped vanadium dioxide (VO$_2$), such as titanium or chromium-doped vanadium dioxide (VO$_2$)) may exhibit a significant increase in resistance (i.e., such as a change from being conductive to insulative) when a critical electric field is present and/or when a predetermined temperature is reached, whereas other phase transition materials (e.g., un-doped vanadium dioxide (VO$_2$)) may exhibit a significant decrease in resistance (i.e., such as a change from being insulative to conductive) when a critical electric field is present and/or when a predetermined temperature is reached. Since the local environmental conditions (i.e., electric fields and/or temperature) will vary as a function of the voltages applied to the various MOSFET terminals, the environmental condition-dependent nature of a phase transition material in the second section 132 of the gate electrode 134 can be exploited (i.e., capitalized upon) in order to block the creation of a GIDL-causing electric field, when the MOSFET 100A is in the OFF state, without compromising drive current, when the MOSFET 100B is in the ON state.

Specifically, the phase transition material for the second section 132 of the gate electrode 134 can be pre-selected in order to ensure that it is insulative at a time during operation of the MOSFET 100A when the voltage difference between the drain region 122 and the source region 121 (i.e., the $V_{DS}$) is at or above a threshold difference (e.g., at or above 1 volt) and when the MOSFET 100A is in the OFF state. Being insulative at this time prevents the creation of the electric field and, particularly, the band-to-band tunneling that causes GIDL. For example, the phase transition material can be pre-selected in order to ensure that it is insulative when a first voltage on the source region 121 is 0 volts and when a second voltage on the drain region 122 is 1 volt such that the $V_{DS}$ is 1 volt and further when a third voltage on the gate structure 130a is 0 volts (i.e., when the MOSFET 100A is in the OFF state). Additionally, the phase transition material can be pre-selected in order to ensure that it conductive at a time during operation of the MOSFET 100A when the $V_{DS}$ is at or above the threshold difference (e.g., at or above 1 volt) and when the MOSFET 100A is in the ON state. Being conductive at this time ensures that the drive current of the MOSFET 100A is high. For example, the phase transition material can be pre-selected in order to ensure that it is conductive when the first voltage on the source region 121 is 0 volts and when the second voltage on the drain region 122 is 1 volt such that the $V_{DS}$ is 1 volt and further when the third voltage on the gate structure 130a is 1 volt (i.e., when the MOSFET 100A is in the ON state).

One exemplary phase transition material that can be insulative and conductive during MOSFET operation as described above and, thus, can be pre-selected for incorporation into the second section 132 of the gate electrode 134 is doped vanadium dioxide ($VO_2$) and, particularly, vanadium dioxide ($VO_2$) doped with a dopant such as titanium, chromium or any other suitable dopant which causes the doped vanadium dioxide ($VO_2$) to exhibit a significant increase in resistance (i.e., such as a change from being conductive to insulative) when a critical electrical field is present and/or when a predetermined temperature is reached. For example, the second section 132 can comprise titanium or chromium-doped vanadium dioxide ($VO_2$), where the atomic percentage of titanium or chromium is 0.1-1%.

It should be noted that when the phase transition material for the second section 132 of the gate electrode 134 is pre-selected in order to ensure that it is insulative and conductive during MOSFET operation as described above, it will also necessarily be conductive, when the $V_{DS}$ is below the threshold difference (e.g., below 1 volt, such as when the voltage applied to both the source and drain regions is 0) and when the MOSFET 100A is in the OFF state. However, there would be no need to have the second section 132 of the gate electrode 134 be insulative at this time, since the creation of the electric field and, particularly, the band-to-band tunneling that causes GIDL only occurs when the $V_{DS}$ is at or above the threshold difference. It should also be noted that when the phase transition material for the second section 132 of the gate electrode 134 is pre-selected in order to ensure that it is insulative and conductive during MOSFET operation as described above, it will also necessarily be insulative, when the $V_{DS}$ is below the threshold difference (e.g., below 1 volt, such as when the voltage applied to both the source and drain regions is 0) and when the MOSFET 100A is in the ON state resulting in a lower drive current. However, such a trade-off with drive current under such conditions can be acceptable depending upon usage in order to avoid GIDL (e.g., such a trade-off with drive current under such conditions can be acceptable in radio frequency (RF) applications, which do not require linear operation).

Additional features of the MOSFET 100A can include, but are not limited to, the following: metal silicide layers (not shown) positioned on the surface of the source and drain regions 121-122 and gate structure 130a; one or more inter-layer dielectrics (not shown) 170 covering the MOSFET 100A; and contacts extending vertically through the inter-layer dielectrics 170 to the source and drain regions 121-122 (see contacts 161-162), to the gate structure 130a and to the substrate 102 below.

Referring to FIG. 2, in another embodiment of the metal oxide semiconductor field effect transistor (MOSFET) 100B, the gate structure 130b can be a conventional gate structure and, instead, source and drain contact landing pads 151, 152 comprising different phase transition materials can be incorporated into the MOSFET 100B in order to minimize leakage current, such as Gate-Induced Drain Leakage (GIDL), when the MOSFET 100B is in its OFF state, without compromising the drive current, when the MOSFET 100B is in its ON state.

Specifically, in this embodiment, the gate electrode 134 of the gate structure 130b can comprise a conventional gate conductor layer. For example, the gate electrode 134 can comprise a doped polysilicon material (e.g., an N-type polysilicon in the case of an N-type MOSFET or a P-type polysilicon in the case of a P-type MOSFET). Alternatively, the gate electrode 134 can comprise a metal or metal alloy material (e.g., an N-type metal or N-type metal alloy in the case of an N-type MOSFET or a P-type metal or P-type metal alloy in the case of a P-type MOSFET).

Additionally, the MOSFET 100B can comprise a source contact landing pad 151 (i.e., a first contact landing pad) on the top surface of the semiconductor body 106 adjacent to the source region 121 (e.g., immediately adjacent to the deep source region 121b) and a drain contact landing pad 152 (i.e., a second contact landing pad) on the top surface of the semiconductor body adjacent to the drain region 122 (e.g., immediately adjacent to the deep drain region 122b). These contact landing pads 151, 152 can each comprise a relatively thin layer of phase transition material. However, the phase transition materials should be different. That is, the first contact landing pad 151 can comprise a relatively thin layer of a first phase transition material and the second contact landing pad 152 can comprise a relatively thin layer of a second phase transition material different from the first phase transition material. Since the local environmental conditions (i.e., electric fields and/or temperature) at these contact landing pads 151, 152 will vary as a function of the voltages applied to the various MOSFET terminals, the environmental condition-dependent nature of the phase transition materials of these contact landing pads 151, 152 can be exploited (i.e., capitalized upon) in order to block the creation of a GIDL-causing electric field, when the MOSFET 100B is in the OFF state, without compromising drive current, when the MOSFET 100B is in the ON state.

Specifically, the first and second phase transition materials can be pre-selected in order to ensure that they are both insulative at a time during operation of the MOSFET 100B when the voltage difference between the drain region 122 and the source region 121 (i.e., the $V_{DS}$) is at or above a threshold difference (e.g., at or above 1 volt) and when the MOSFET 100B is in the OFF state. Being insulative at this time prevents the creation of the electric field and, particularly, the band-to-band tunneling that causes GIDL. For example, the first and second phase transition materials can be pre-selected in order to ensure that they are both insulative when a first voltage on the source region 121 is 0 volts and when a second voltage on the drain region 122 is 1 volt such that the $V_{DS}$ is 1 volt and further when a third voltage on the gate structure 130b is 0 volts (i.e., when the MOSFET 100A is in the OFF state). Additionally, the first and second phase transition materials can be pre-selected in order to ensure that they are both conductive at a time during operation of the MOSFET 100B when the $V_{DS}$ is at or above the threshold difference (e.g., at or above 1 volt) and when the MOSFET 100B is in the ON state. Being conductive at this time ensures that the drive current of the MOSFET 100B is high. For example, the first and second phase transition materials can be pre-selected in order to ensure that they are both conductive when the first voltage on the source region 121 is 0 volts and when the second voltage on the drain region 122 is 1 volt such that the $V_{DS}$ is 1 volt and further when the third voltage on the gate structure 130b is 1 volt (i.e., when the MOSFET 100B is in the ON state).

It should be noted that for this to be the case, the first phase transition material must be a phase transition material that changes from a high resistance material (i.e., an insulative material) to a low resistance material (i.e., a conductive material) beyond a critical field. One exemplary phase transition material that can be insulative and conductive as required for the first phase transition material of the source contact landing pad 151 (i.e., the first contact landing pad) is un-doped vanadium dioxide ($VO_2$). Contrarily, the second phase transition material must be a phase transition material that changes from a low resistance material (i.e., a conductive material) to a high resistance material (i.e., an insulative material) beyond a critical field. One exemplary phase transition material that can be insulative and conductive as required for the second phase transition material for the drain contact landing pad 152 (i.e., the second contact landing pad) is doped vanadium dioxide ($VO_2$) and, particularly, vanadium dioxide ($VO_2$) doped with a dopant such as titanium, chromium or any other suitable dopant which causes the doped vanadium dioxide ($VO_2$) to exhibit a significant increase in resistance (i.e., such as a change from being conductive to insulative) when a critical electric field is present and/or when a predetermined temperature is reached. For example, the drain contact landing pad 152 can comprise a relatively thin layer of titanium or chromium-doped vanadium dioxide ($VO_2$) where the atomic percentage of titanium or chromium is 0.1-1%.

It should also be noted that when the first and second phase transition materials for the source and drain contact landing pads 151, 152 are pre-selected in order to ensure that they are insulative and conductive during MOSFET operation as described above, the drain contact landing pad 152 will also necessarily be conductive, when the $V_{DS}$ is below the threshold difference (e.g., below 1 volt, such as when the voltage applied to both the source and drain regions is 0) and when the MOSFET 100B is in the OFF state. However, there would be no need to have the drain contact landing pad 152 be insulative at this time, since the creation of the electric field and, particularly, the band-to-band tunneling that causes GIDL occurs only when the $V_{DS}$ is at or above the threshold difference. It should also be noted that when the first and second phase transition materials for the source and drain contact landing pads 151, 152 are pre-selected in order to ensure that they are insulative and conductive during MOSFET operation as described above, the drain contact landing pad 152 will also necessarily be insulative, when the $V_{DS}$ is below the threshold difference (e.g., below 1 volt, such as when the voltage applied to both the source and drain regions is 0) and when the MOSFET 100B is in the ON state resulting in a lower drive current. However, such a trade-off with drive current under such conditions can be acceptable depending upon usage in order to avoid GIDL (e.g., such a trade-off with drive current under such conditions can be acceptable in radio frequency (RF) applications, which do not require linear operation).

Additional features of the MOSFET 100B can include, but are not limited to, the following: metal silicide layers (not shown) positioned, for example, on the top surface of the gate structure 130b and/or between the source and drain regions 121, 122 and the contact landing pads 151-152; one or more interlayer dielectrics (not shown) 170 covering the MOSFET 100B; and contacts extending vertically through the interlayer dielectrics 170 to the source and drain contact landing pads 151 and 152 (see contacts 161 and 162), to the gate structure 130b and to the substrate 102 below.

Referring to FIG. 3, another embodiment of the metal oxide semiconductor field effect transistor (MOSFET) 100C can comprise both an asymmetric gate structure 130a with a gate electrode 134 having a phase transition material section 132 (e.g., as described in detail above) and source and drain contact landing pads 151, 152 comprising different phase transition materials (e.g., as described in detail above) in order to minimize leakage current, such as Gate-Induced Drain Leakage (GIDL), when the MOSFET 100C is in its OFF state, without compromising the drive current, when the MOSFET 100C is in its ON state. In this case, the same phase transition material (e.g., doped vanadium dioxide ($VO_2$), such as chromium or titanium-doped vanadium dioxide ($VO_2$)) can be incorporated into the second section 132 of the asymmetric gate structure 130a and the drain contact landing pad 152.

Figure 4:
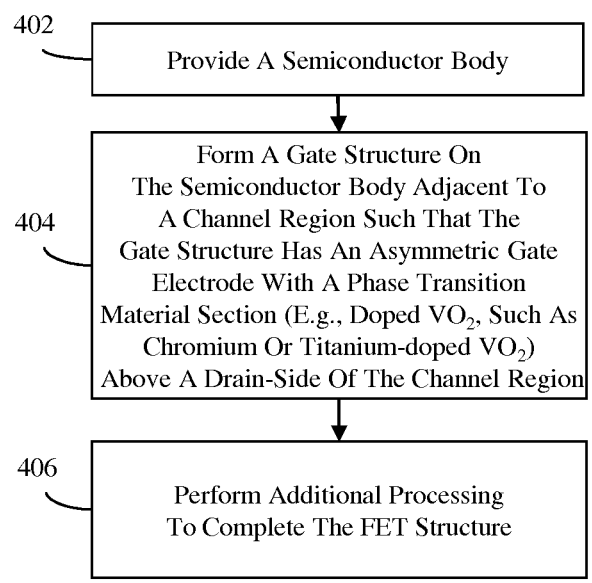
FIG. 4 is a flow diagram illustrating an embodiment of a method of forming a metal oxide semiconductor field effect transistor.

Referring to the flow diagram of FIG. 4, also disclosed herein is an embodiment of a method of forming the metal oxide field effect transistor (MOSFET) 100A described above and illustrated in FIG. 1 as having an asymmetric gate structure 130 with a gate electrode 134 that has a phase transition material section 132 designed to minimize leakage current, such as Gate-Induced Drain Leakage (GIDL), when the MOSFET 100A is in its OFF state, without compromising the drive current, when the MOSFET 100A is in its ON state.

Figure 5:
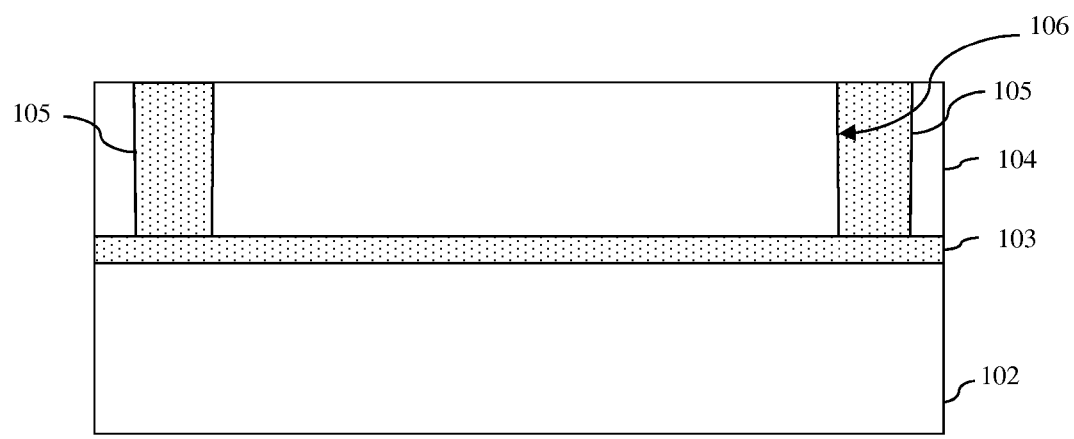
FIG. 5 is a cross-section diagram illustrating a partially completed metal oxide semiconductor field effect transistor formed according to the flow diagram of FIG. 4.

Specifically, the method can comprise providing a semiconductor body 106 (402, see FIG. 5). As illustrated, this semiconductor body 106 can comprise a portion of a semiconductor layer of a semiconductor-on-insulator (SOI) wafer. Such an SOI wafer can comprise a semiconductor substrate 102 (e.g., a silicon substrate or other semiconductor substrate), an insulator layer 103 (e.g., a silicon oxide layer or other suitable insulator layer) on the substrate 102 and a semiconductor layer 104 (e.g., a single crystalline silicon layer, a single crystalline gallium nitride layer or other suitable semiconductor layer) on the insulator layer 103. The portion of the semiconductor layer that makes up the semiconductor body 106 can be defined, for example, by a trench isolation region 105. This trench isolation region 105 can, for example, comprise a conventional shallow trench isolation (STI) structure comprising a trench extending vertically through the semiconductor layer to the insulator layer 103 and filled with one or more isolation materials (e.g., a silicon oxide, silicon nitride, silicon oxynitride, etc.). Alternatively, the semiconductor body 106 can comprise a portion, as defined by a trench isolation region 105, of a bulk semiconductor wafer (e.g., a bulk single crystalline silicon wafer) or any other suitable wafer (e.g., a hybrid orientation (HOT) wafer) (not shown). Alternatively, the semiconductor body 106 can comprise a fin-shaped semiconductor body for a non-planar, multi-gate, MOSFET (e.g., a dual-gate MOSFET or a tri-gate MOSFET) (not shown).

The method can further comprise forming an asymmetric gate structure 130a on the semiconductor body 106 adjacent to a channel region 110 contained therein and, optionally, overlapping source and drain regions 121, 122 and, particularly, shallow source and drain extension regions 121a, 122a in the semiconductor body 106 on opposing sides of the channel region 110 (404, see FIG. 1). The asymmetric gate structure 130a can be formed at process 404 such that it comprises a gate dielectric layer 135 (e.g., a gate oxide layer, a high-k gate dielectric layer or any other suitable gate dielectric layer) on the surface of the semiconductor body 106 immediately adjacent to the channel region 110 and a gate electrode 134 with two discrete sections, including a phase transition material section 132, on the gate dielectric layer 135, as described in detail above and illustrated in FIG. 1.

The phase transition material used to form the asymmetric gate structure 130a with the phase transition material section 132 at process 404 of FIG. 4 can be pre-selected in order to ensure that it is insulative when at a time during operation of the MOSFET 100A when the voltage difference between the drain region 122 and the source region 121 (i.e., the $V_{DS}$) is at or above a threshold difference (e.g., at or above 1 volt) and when the MOSFET 100A is in the OFF state. Being insulative at this time prevents the creation of the electric field and, particularly, the band-to-band tunneling that causes GIDL. For example, the phase transition material can be pre-selected in order to ensure that it is insulative when a first voltage on the source region 121 is 0 volts and when a second voltage on the drain region 122 is 1 volt such that the $V_{DS}$ is 1 volt and further when a third voltage on the gate structure 130a is 0 volts (i.e., when the MOSFET 100A is in the OFF state). Additionally, this phase transition material can be pre-selected in order to ensure that it conductive at a time during operation of the MOSFET 100A when the $V_{DS}$ is at or above the threshold difference (e.g., at or above 1 volt) and when the MOSFET 100A is in the ON state. Being conductive at this time ensures that the drive current of the MOSFET 100A is high. For example, the phase transition material can be pre-selected in order to ensure that it is conductive when the first voltage on the source region 121 is 0 volts and when the second voltage on the drain region 122 is 1 volt such that the $V_{DS}$ is 1 volt and further when the third voltage on the gate structure 130a is 1 volt (i.e., when the MOSFET 100A is in the ON state).

One exemplary phase transition material that can be insulative and conductive during MOSFET operation as described above and, thus, can be pre-selected for incorporation into the second section 132 of the gate electrode 134 at process 404 is doped vanadium dioxide ($VO_2$), such as vanadium dioxide ($VO_2$) doped with a dopant, such as chromium, titanium or any other suitable dopant which causes the doped vanadium dioxide ($VO_2$) to exhibit a significant increase in resistance (i.e., such as a change from being conductive to insulative) when a critical electric field is present and/or when a predetermined temperature is reached.

Figure 6:
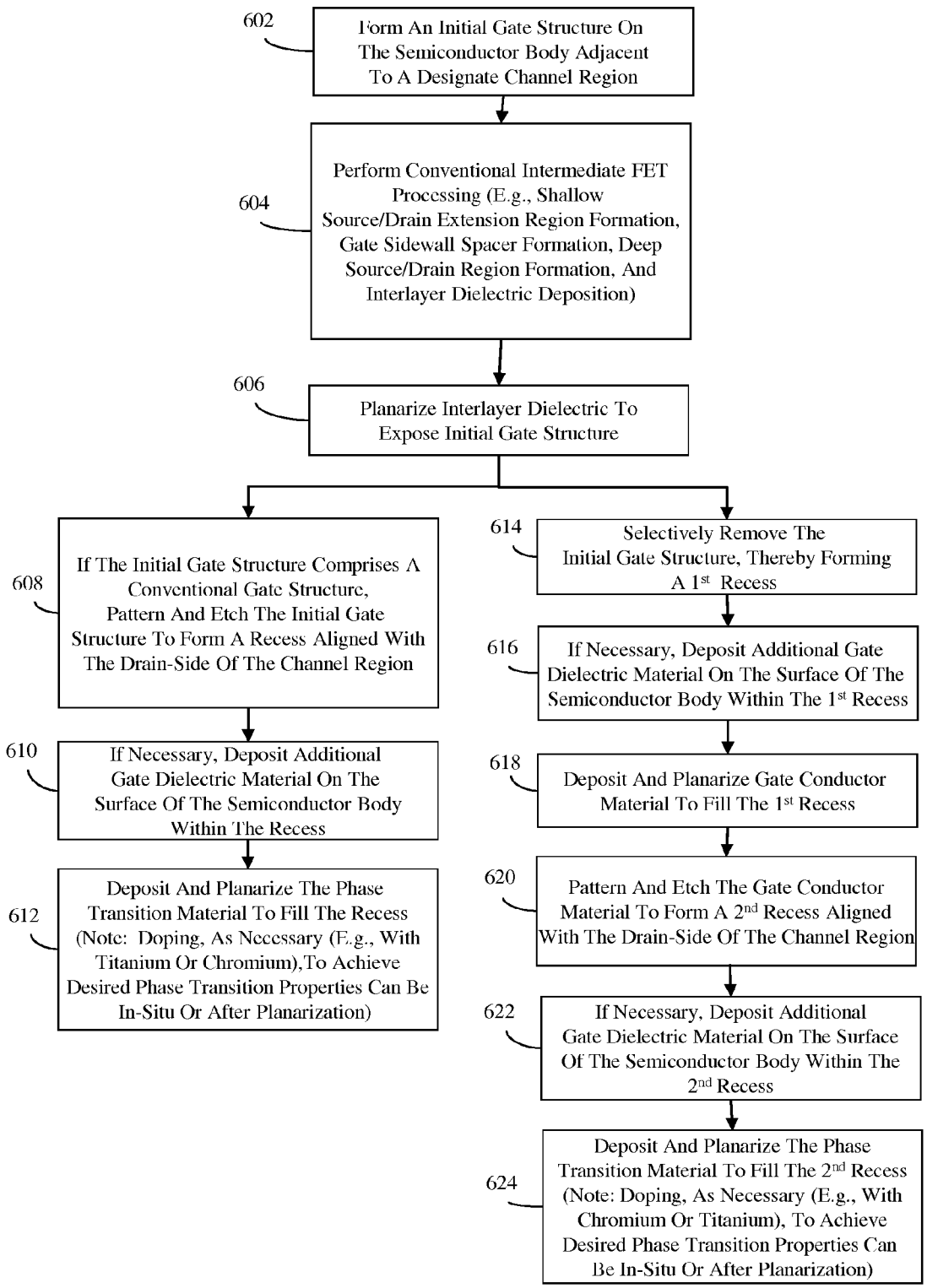
FIG. 6 is a flow diagram further illustrating process step 404 for FIG. 4.

Any suitable technique for forming such an asymmetric gate structure 130a at process 404 could be used. For example, as illustrated in FIG. 6, a replacement gate process could be used.

Figure 7:
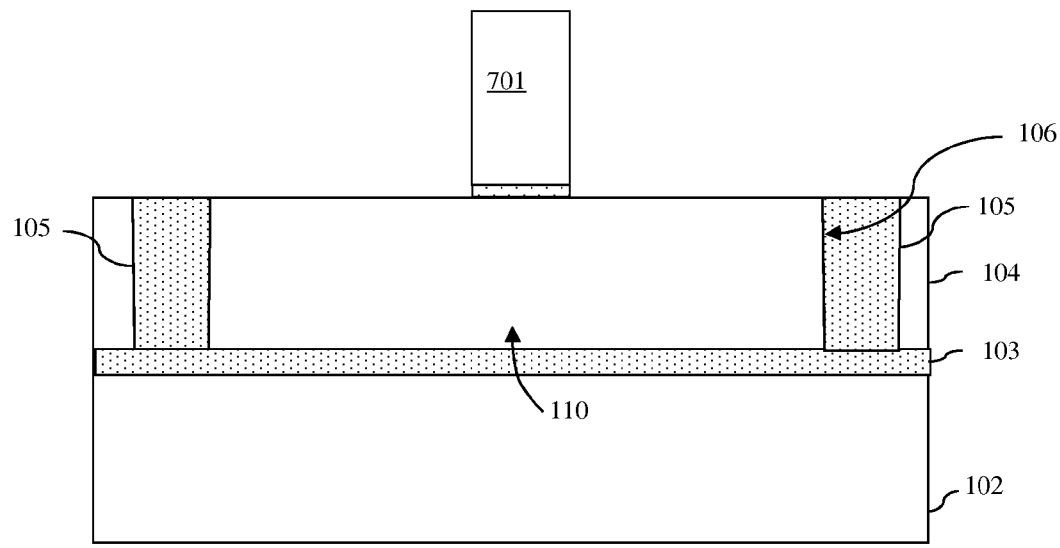
FIG. 7 is a cross-section diagram illustrating a partially completed metal oxide semiconductor field effect transistor formed according to the flow diagram of FIG. 6.

That is, an initial gate structure 701 can be formed on the semiconductor body 106 adjacent to a designated channel region 110 (602, see FIG. 7). This initial gate structure 701 can comprise a conventional gate structure comprising a lithographically patterned dielectric layer-conductor layer stack. Alternatively, this initial gate structure 701 can comprise a dummy gate structure comprising any other suitable material that can be selectively etched over interlayer dielectric material (as discussed in greater detail below at process 608 or 614).

Figure 8:
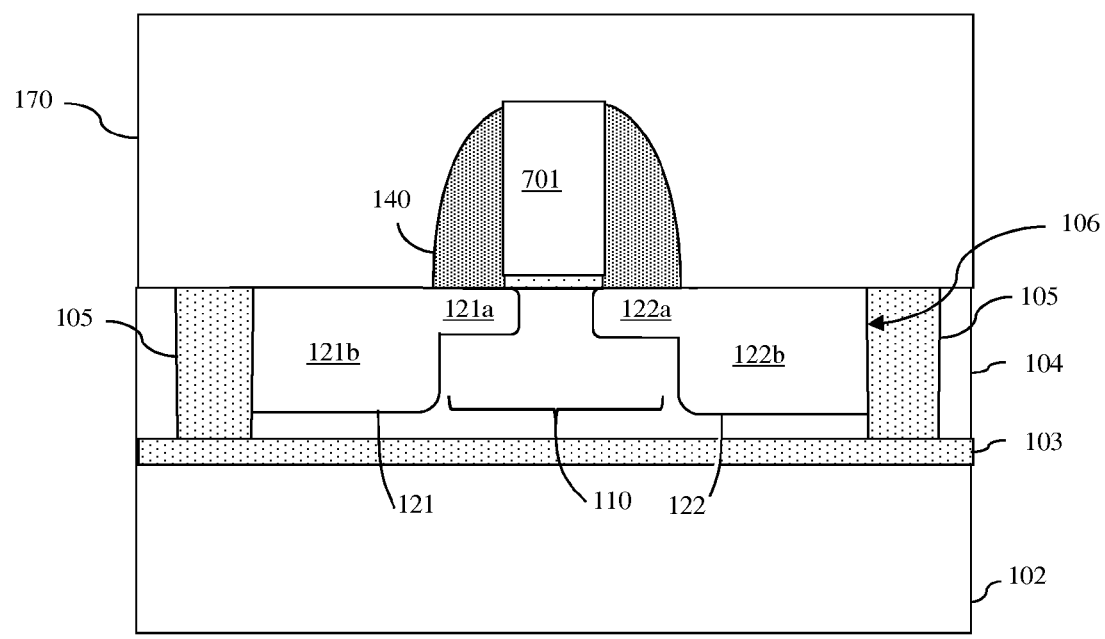
FIG. 8 is a cross-section diagram illustrating a partially completed metal oxide semiconductor field effect transistor formed according to the flow diagram of FIG. 6.
Figure 9:
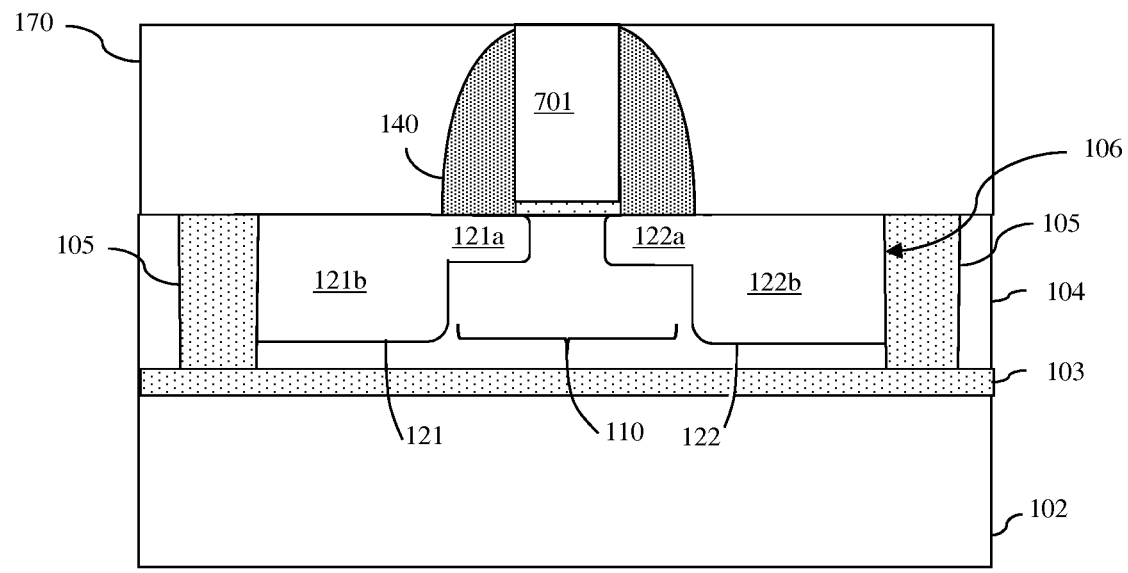
FIG. 9 is a cross-section diagram illustrating a partially completed metal oxide semiconductor field effect transistor formed according to the flow diagram of FIG. 6.

Once the initial gate structure 701 is formed conventional intermediate field effect transistor (FET) processing can be performed (604, see FIG. 8). This intermediate FET processing can include, but is not limited to, shallow source/drain extension region 121a, 122a formation, gate sidewall spacer 140 formation, deep source/drain region 121b, 122b formation, metal silicide formation, and interlayer dielectric 170 deposition). Such intermediate FET processing is well known in the art and, thus, the details are omitted from this specification in order to allow the reader to focus on the salient aspects of the embodiments. Next, the interlayer dielectric 170 can be planarized to expose the top surface of the initial gate structure 701 (606, see FIG. 9).

Figure 10:
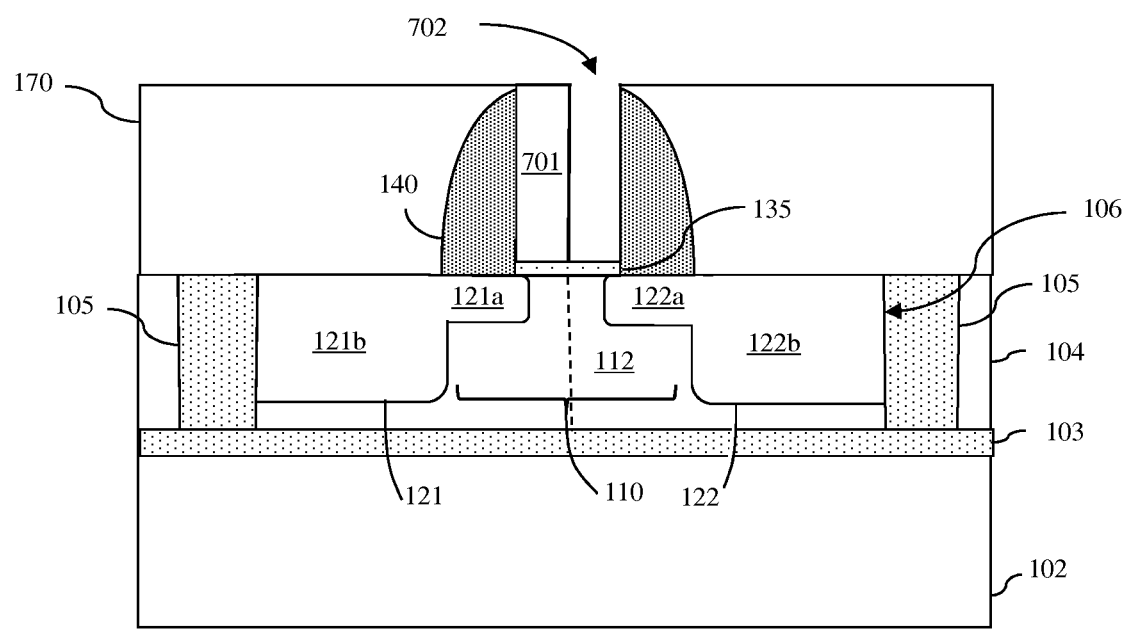
FIG. 10 is a cross-section diagram illustrating a partially completed metal oxide semiconductor field effect transistor formed according to the flow diagram of FIG. 6.
Figure 11:
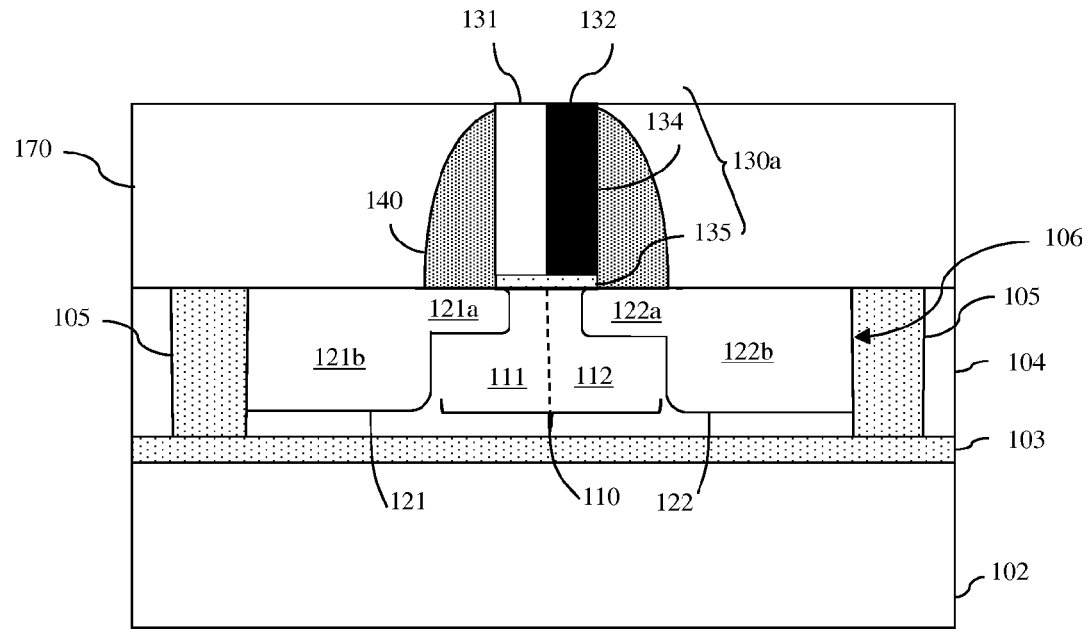
FIG. 11 is a cross-section diagram illustrating a partially completed metal oxide semiconductor field effect transistor formed according to the flow diagram of FIG. 6.

If the initial gate structure 701 comprises a conventional gate structure, then after it is exposed at process 606 it can be lithographically patterned and etched to form a recess 702 that is aligned with the second side 112 (i.e., aligned with the drain-side) of the channel region 110 and between the gate sidewall spacers 140 (608, see FIG. 10). If the surface of the semiconductor body 106 is exposed within the recess 702, additional gate dielectric material can be deposited to complete the gate dielectric layer 135 (610). Then, a phase transition material can be deposited and then planarized to fill the recess 702, thereby creating the gate electrode 134 with a first section 131 (i.e., the remaining portion of the initial gate structure 701) aligned with the first side 111 and, particularly, the source-side of the channel region 110 and with a second section 132, which comprises phase transition material, positioned laterally adjacent to the first section 131 and aligned with the second side 112 and, particularly, the drain-side of the channel region (612, see FIG. 11). As mentioned above, one exemplary phase transition material that can be insulative and conductive during MOSFET operation as described above and, thus, can be pre-selected for incorporation into the second section 132 of the gate electrode can be doped vanadium dioxide ($VO_2$), such as vanadium dioxide ($VO_2$) doped with chromium, titanium or any other suitable dopant which causes the doped vanadium dioxide ($VO_2$) to exhibit a significant increase in resistance (i.e., such as a change from being conductive to insulative) when a critical electric field is present and/or when a predetermined temperature is reached. Thus, at process 612, a phase transition material of vanadium dioxide ($VO_2$) can be either in-situ doped or subsequently implanted with chromium, titanium, or another suitable dopant (e.g., to achieve an atomic percentage of 0.1-1).

Figure 12:
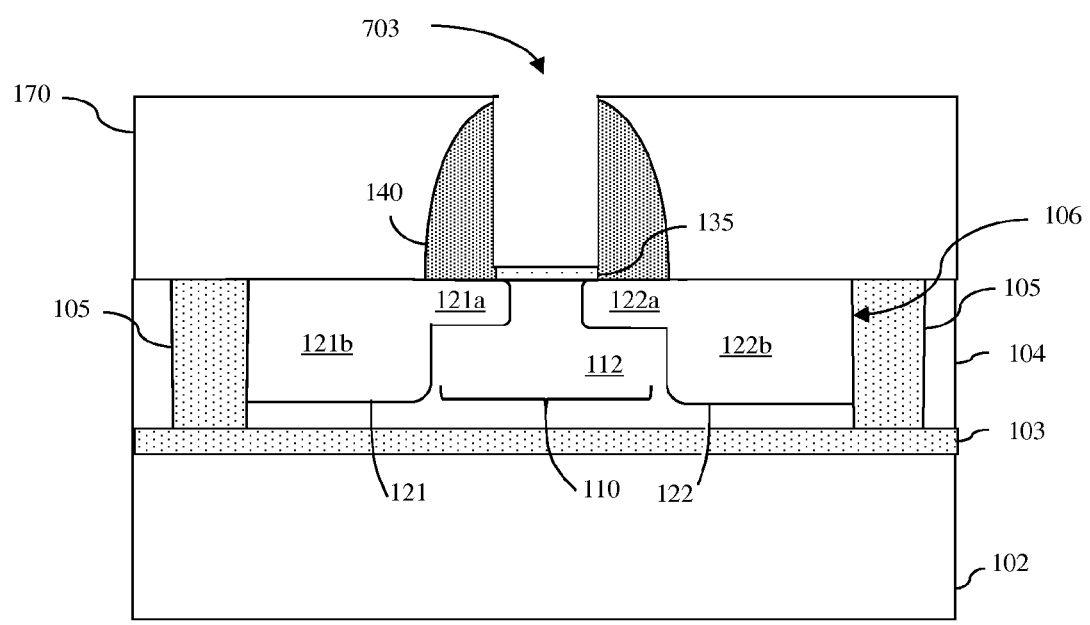
FIG. 12 is a cross-section diagram illustrating a partially completed metal oxide semiconductor field effect transistor formed according to the flow diagram of FIG. 6.
Figure 13:
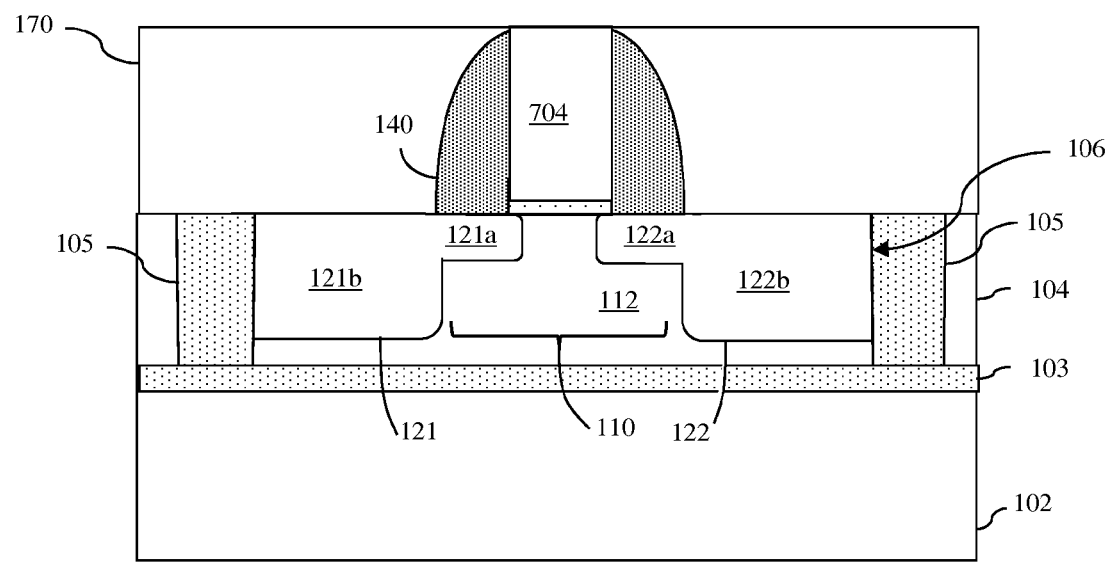
FIG. 13 is a cross-section diagram illustrating a partially completed metal oxide semiconductor field effect transistor formed according to the flow diagram of FIG. 6.
Figure 14:
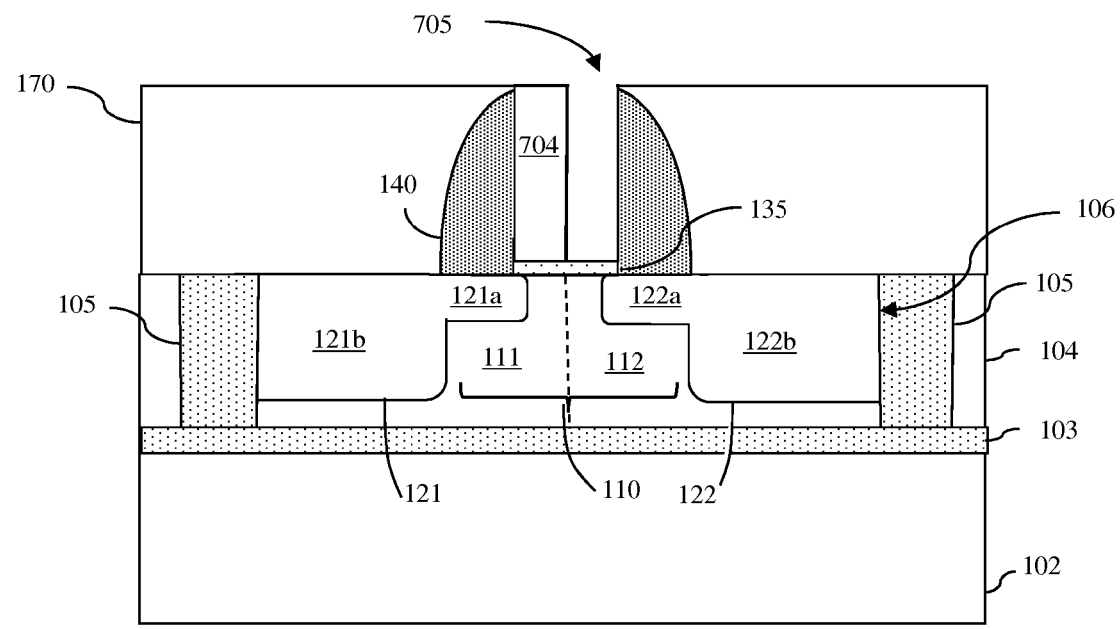
FIG. 14 is a cross-section diagram illustrating a partially completed metal oxide semiconductor field effect transistor formed according to the flow diagram of FIG. 6.
Figure 15:
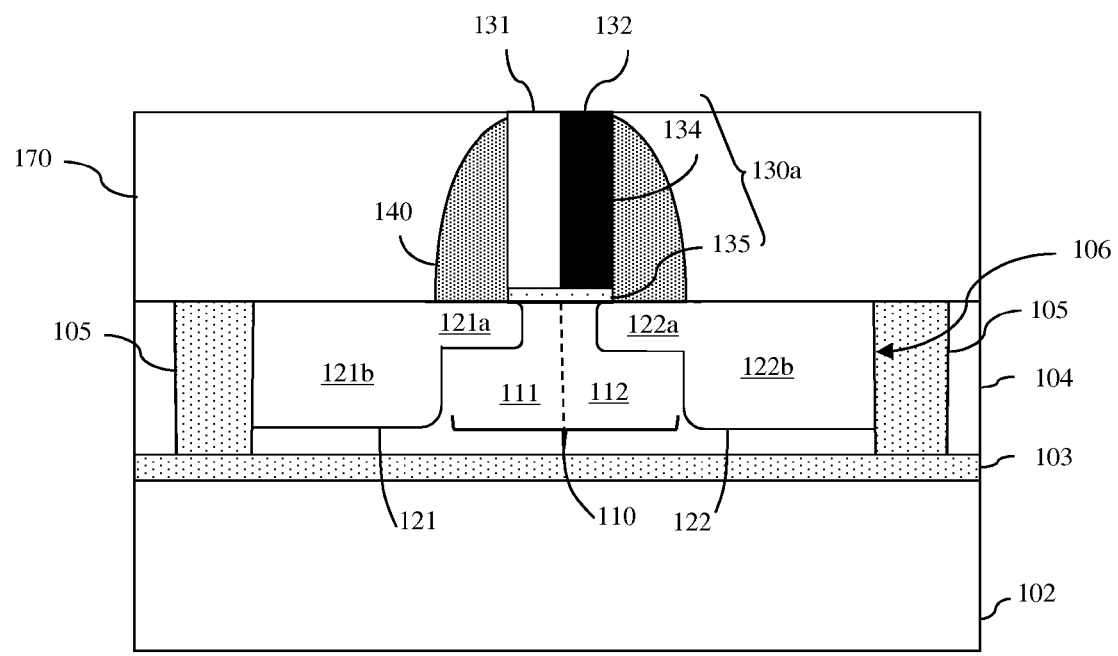
FIG. 15 is a cross-section diagram illustrating a partially completed metal oxide semiconductor field effect transistor formed according to the flow diagram of FIG. 6.

Alternatively, once the initial gate structure 701 is exposed, it can be selectively etched such that it is removed in its entirety, thereby forming a recess 703 between the gate sidewall spacers 140 (614, see FIG. 12). Then, if necessary (e.g., if the surface of the semiconductor body 106 is exposed within the recess 703), gate dielectric material can be deposited to form the gate dielectric layer 135 (616). Then, the recess 703 can be filled with a gate conductor material 704 (618, see FIG. 13) and the gate conductor material 704 can be lithographically patterned and etched to form another recess 705 that is aligned with the second side 112 (i.e., aligned with the drain-side) of the channel region 110 (620, see FIG. 14). If the surface of the semiconductor body 106 is exposed within the recess 705, additional gate dielectric material can be deposited to complete the gate dielectric layer 135 (622). Then, a phase transition material can be deposited to fill the recess 705, thereby creating the gate electrode 134 with a first section 131 (i.e., the remaining portion of the gate conductor material 704) aligned with the first side 111 and, particularly, the source-side of the channel region 110 and with a second section 132, which comprises phase transition material, positioned laterally adjacent to the first section 131 and aligned with the second side 112 and, particularly, the drain-side of the channel region 110 (624, see FIG. 15). Again, as mentioned above, one exemplary phase transition material that can be insulative and conductive during MOSFET operation as described above and, thus, can be pre-selected for incorporation into the second section 132 of the gate electrode can be doped vanadium dioxide (VO$_2$) such as vanadium dioxide (VO$_2$) doped with chromium, titanium or any other suitable dopant which causes the doped vanadium dioxide (VO$_2$) to exhibit a significant increase in resistance (i.e., such as a change from being conductive to insulative) when a critical electric field is present and/or when a predetermined temperature is reached. Thus, at process 624, a phase transition material of vanadium dioxide (VO$_2$) can be either in-situ doped or subsequently implanted with chromium, titanium or another suitable dopant (e.g., to achieve an atomic percentage of 0.1-1).

It should be noted that the processes 602-604 of FIG. 6 (i.e., initial gate structure formation and intermediate FET processing) can be performed such that the initial gate structure 701 overlaps the source region 121 and drain region 122 and, more particularly, overlaps the shallow source extension region 121a and the shallow drain extension region 122a. Thus, when the gate electrode 134 is completed at process 612 or 622 using the replacement gate technique described above, the first section 131 of the gate electrode 134 will overlap the source region 122 (and, more particularly, the shallow source extension region 121a) and the second section 132 of the gate electrode 134 will overlap the drain region 122 (and, more particularly, the shallow drain extension region 122a).

After the gate structure 130a is formed at process 404, additional conventional field effect transistor (FET) processing can be performed in order to complete the MOSFET 100A structure of FIG. 1 (406). This additional processing can include, but is not limited to, additional interlayer dielectric 170 deposition, contact 161, 162 formation, etc. Such FET processing is well known in the art and, thus, the details are omitted from this specification in order to allow the reader to focus on the salient aspects of the embodiments.

Figure 16:
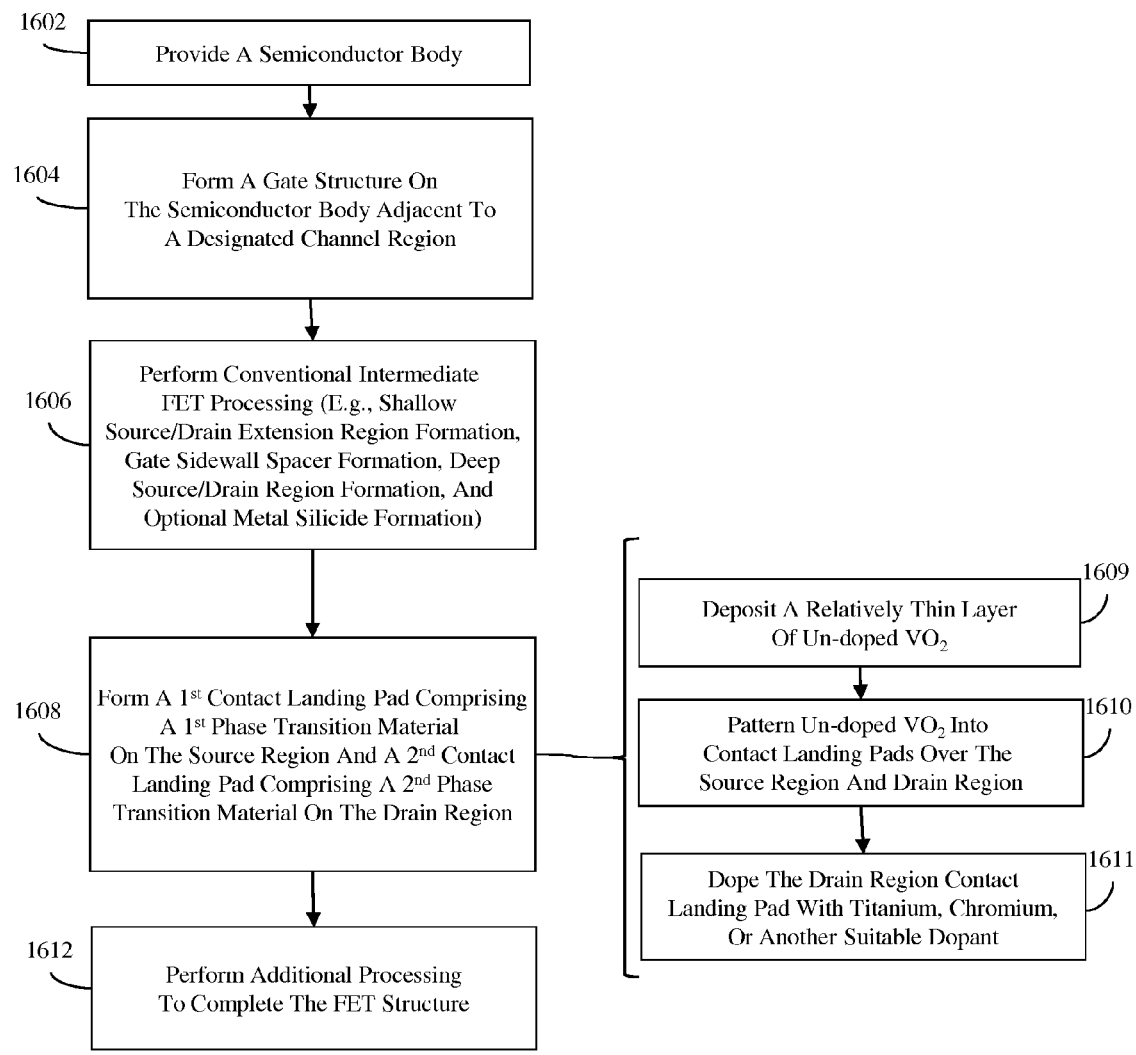
FIG. 16 is a flow diagram illustrating another embodiment of a method of forming a metal oxide semiconductor field effect.

Referring to the flow diagram of FIG. 16, also disclosed herein is an embodiment of a method of forming the metal oxide semiconductor field effect transistor (MOSFET) 100B of FIG. 2, having a source contact landing pad 151 and a drain contact landing pad 152 comprising different phase transition materials (i.e., a first phase transition material and a second phase transition material different from the first phase transition material, respectively) in order to minimize leakage current, such as Gate-Induced Drain Leakage (GIDL), when the MOSFET 100B is in its OFF state, without compromising the drive current, when the MOSFET 100B is in its ON state.

Specifically, the method can comprise providing a semiconductor body 106 (1602, see FIG. 5 and detailed discussion above).

Figure 17:
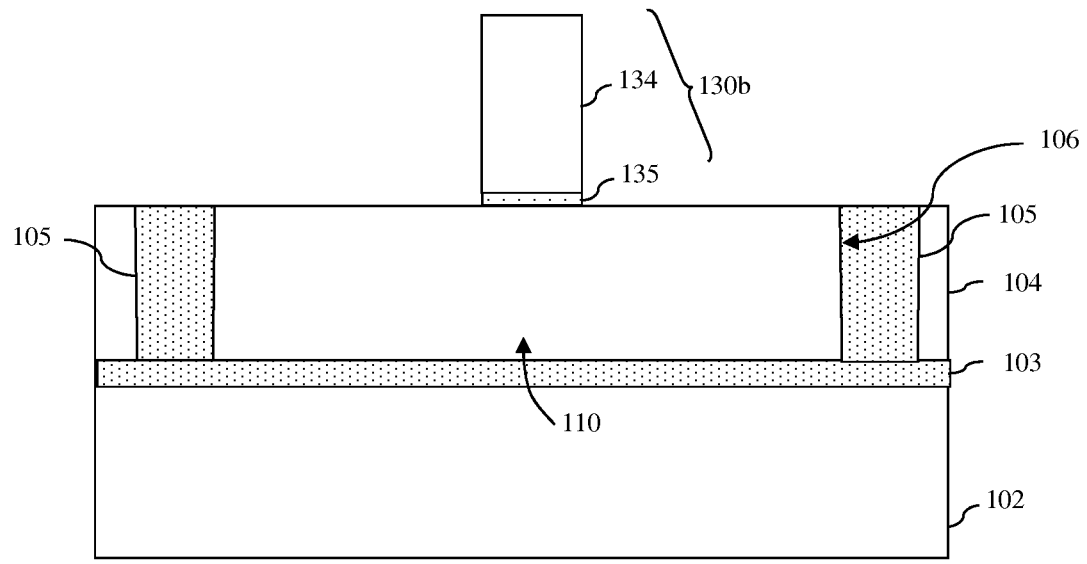
FIG. 17 is a cross-section diagram illustrating a partially completed metal oxide semiconductor field effect transistor formed according to the flow diagram of FIG. 16.

The method can further comprise forming a gate structure 130b on the semiconductor body 106 adjacent to a designated channel region 110 contained therein (1604, see FIG. 17). Specifically, a gate dielectric layer 135 (e.g., a gate oxide layer, a high-k gate dielectric layer or any other suitable gate dielectric layer) can be formed (e.g., deposited) on the surface of the semiconductor body 106 and a gate conductor layer 134 (e.g., a polysilicon layer) can be formed (e.g., deposited) on the gate dielectric layer 135. The gate dielectric layer-gate conductor layer stack can then be lithographically patterned and etched to form the gate structure 130b over the designated channel region 110.

Figure 18:
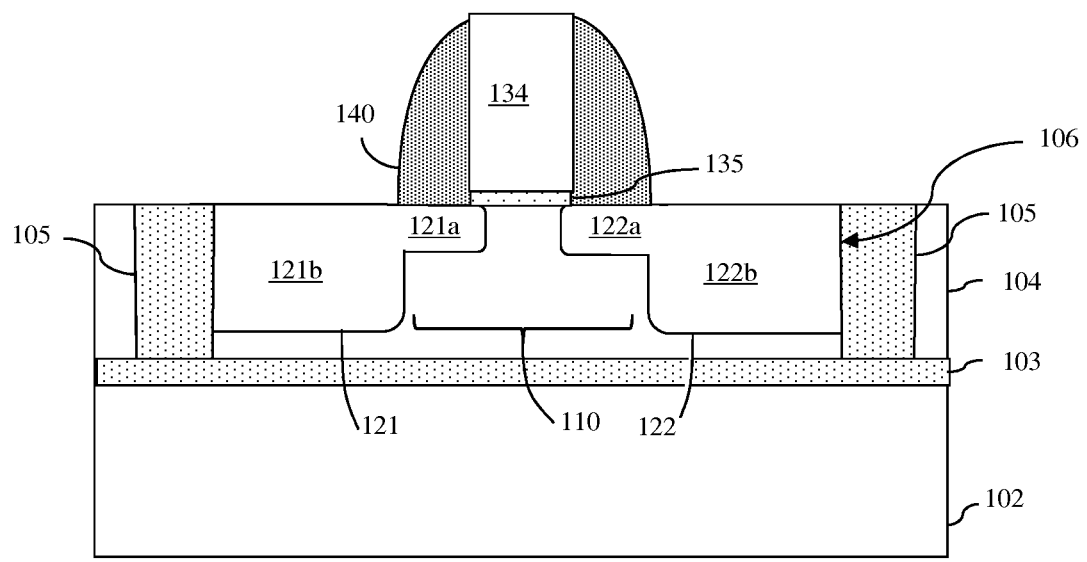
FIG. 18 is a cross-section diagram illustrating a partially completed metal oxide semiconductor field effect transistor formed according to the flow diagram of FIG. 16.

Once the gate structure 130b is formed at process 1604, conventional intermediate field effect transistor (FET) processing can be performed (1606, see FIG. 18). This intermediate FET processing can include, but is not limited to, shallow source/drain extension region 121a, 122a formation, gate sidewall spacer 140 formation, deep source/drain region 121b, 122b formation and, optionally, metal silicide formation (not shown). Such intermediate FET processing is well known in the art and, thus, the details are omitted from this specification in order to allow the reader to focus on the salient aspects of the embodiments.

Figure 19:
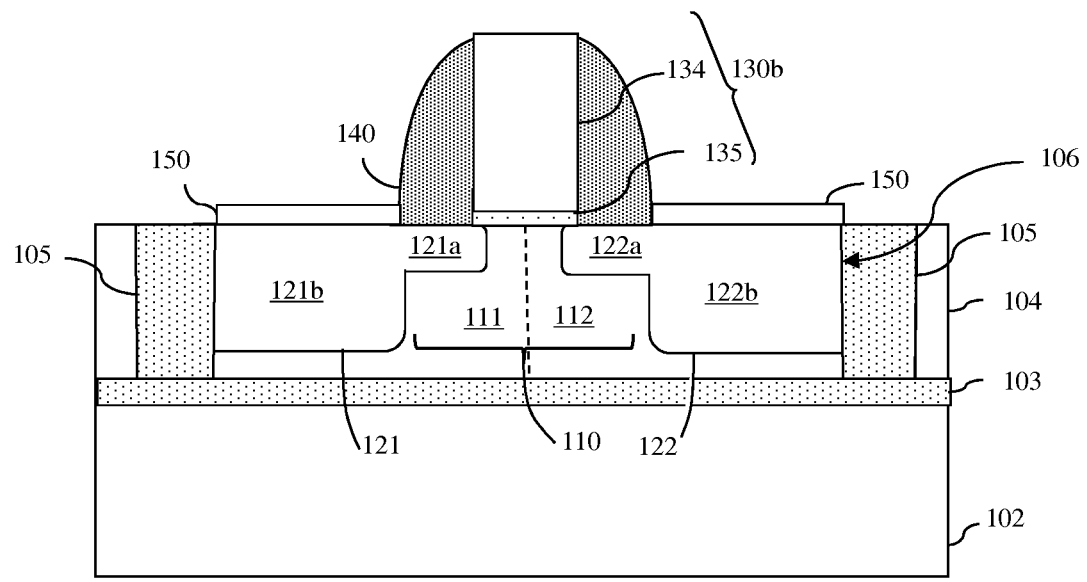
FIG. 19 is a cross-section diagram illustrating a partially completed metal oxide semiconductor field effect transistor formed according to the flow diagram of FIG. 16.
Figure 20:
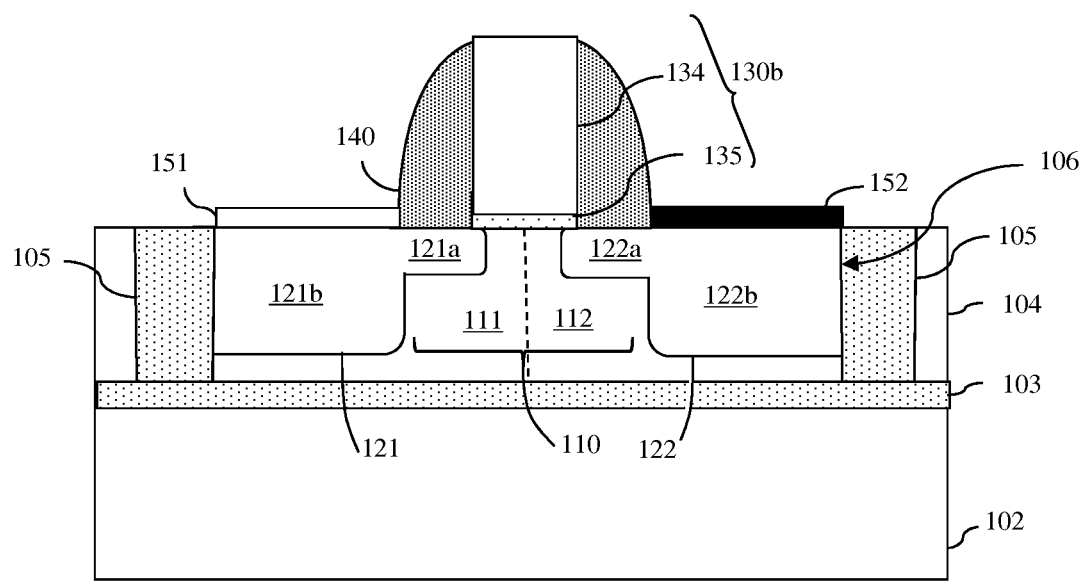
FIG. 20 is a cross-section diagram illustrating a partially completed metal oxide semiconductor field effect transistor formed according to the flow diagram of FIG. 16.

Next, the method can comprise forming contact landing pads on the semiconductor body 106 adjacent to a source region 121 and a drain region 122, respectively, (1608, see FIGS. 19-20). Specifically, a first contact landing pad can be on formed on the semiconductor body 106 adjacent to the source region 121 such that it comprises a first phase transition material and a second contact landing pad 152 can be formed on the semiconductor body 106 adjacent to the drain region such that it comprises a second phase transition material different from the first phase transition material. The first and second phase transition materials used to form the contact landing pads 151, 152 at process 1608 of FIG. 16 can be pre-selected in order to ensure that they are both insulative at a time during operation of the MOSFET 100B when the voltage difference between the drain region 122 and the source region 121 (i.e., the V$_{DS}$) is at or above a threshold difference (e.g., at or above 1 volt) and when the MOSFET 100B is in the OFF state. Being insulative at this time prevents the creation of the electric field and, particularly, the hand-to-hand tunneling that causes GIDL. For example, the first and second phase transition materials can be pre-selected in order to ensure that they are insulative when a first voltage on the source region 121 is 0 volts and when a second voltage on the drain region 122 is 1 volt such that the V$_{DS}$ is 1 volt and further when a third voltage on the gate structure 130b is 0 volts (i.e., when the MOSFET 100A is in the OFF state). Additionally, the first and second phase transition materials can be pre-selected in order to ensure that they are both conductive at a time during operation of the MOSFET 100B when the V$_{DS}$ is at or above the threshold difference (e.g., at or above 1 volt) and when the MOSFET 100B is in the ON state. Being conductive at this time ensures that the drive current of the MOSFET 100B is high. For example, the first and second phase transition materials can be pre-selected in order to ensure that they are conductive when the first voltage on the source region 121 is 0 volts and when the second voltage on the drain region 122 is 1 volt such that the V$_{DS}$ is 1 volt and further when the third voltage on the gate structure 130b is 1 volt (i.e., when the MOSFET 100B is in the ON state).

In one exemplary embodiment, the process 1608 of forming the contact landing pads 151, 152 can comprise forming (e.g., depositing) a relatively thin layer of un-doped vanadium dioxide 150 (VO$_2$) and then patterning (e.g., lithographically) the un-doped vanadium dioxide (VO$_2$) into pads above the source and drain regions 121-122 (1609-1610, see FIG. 19). Subsequently, the portion of the un-doped vanadium dioxide (VO$_2$) layer 150 over the drain region 122 can be doped with a dopant (e.g., titanium, chromium or another suitable dopant at an atomic percentage of 0.1-1), for example, by masked ion implantation, so that the portion of the un-doped vanadium dioxide (VO$_2$) layer 150 over the source region 121 remains un-doped, thereby creating the first and second contact landing pads 151, 152 with the different phase transition materials (1611, see FIG. 20).

After the source and drain contact landing pads 151, 152 are formed at process 1608, additional conventional field effect transistor (FET) processing can be performed in order to complete the MOSFET 100B structure of FIG. 2 (1612). This additional processing can include, but is not limited to, interlayer dielectric 170 deposition, contact 161, 162 formation, etc. Such FET processing is well known in the art and, thus, the details are omitted from this specification in order to allow the reader to focus on the salient aspects of the embodiments.

It should be understood that the above described method embodiments could also be combined in order to form the metal oxide semiconductor field effect transistor (MOSFET) 100C of FIG. 3 comprising both an asymmetric gate structure 130a with a gate electrode 134 having a phase transition material section 132 (e.g., as described in detail above) and source and drain contact landing pads 151, 152 comprising different phase transition materials (e.g., as described in detail above) in order to minimize leakage current, such as Gate-Induced Drain Leakage (GIDL), when the MOSFET 100C is in its OFF state, without compromising the drive current, when the MOSFET 100C is in its ON state. That is, following process step 1608 of the flow diagram of FIG. 16, wherein source and drain contact landing pads 151, 152 are formed so as to comprise different phase transition materials, process step 404 of the flow diagram of FIG. 4, can be performed using the replacement gate process of FIG. 6 so as to form an asymmetric gate structure 130a. In this case, the same phase transition material (e.g., doped vanadium dioxide ($VO_2$), such as vanadium dioxide ($VO_2$) doped with chromium, titanium or any other suitable dopant which causes the doped vanadium dioxide ($VO_2$) to exhibit a significant increase in resistance (i.e., such as a change from being conductive to insulative) when a critical electric field is present and/or when a predetermined temperature is reached) can be used to form both the drain contact landing pad 152 at process 1608 and the second section 132 of the asymmetric gate structure 130a at process 404.

It should further be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of a metal oxide semiconductor field effect transistor (MOSFET) having phase transition material incorporated into one or more components (e.g., an asymmetric gate structure and/or into source and drain contact landing pads) in order to minimize the electric field between the gate structure and drain region when the MOSFET is in its OFF state and, thereby avoid or at least minimize leakage current, such as Gate-Induced Drain Leakage (GIDL), without compromising the drive current required to maintain a desired circuit speed, when the MOSFET is in its ON state. Specifically, the MOSFET can comprise an asymmetric gate structure with a gate electrode having a first section above the source-side of the channel region and a second section above the drain-side of the channel region. The second section can comprise a phase transition material (e.g., doped vanadium dioxide ($VO_2$), such as chromium or titanium-doped vanadium dioxide ($VO_2$)). Additionally or alternatively, the MOSFET can comprise a source contact landing pad and a drain contact landing pads comprising different phase transition materials (e.g., un-doped vanadium dioxide ($VO_2$) and doped vanadium dioxide ($VO_2$), respectively). In any case, the phase transition materials can be pre-selected so as to be insulative particularly when the MOSFET is in the OFF state and the voltage difference between the drain region and the source region ($V_{DS}$) is high in order to minimize GIDL and so as to be conductive particularly when the MOSFET is in the ON state and $V_{DS}$ is high in order to maintain drive current. Also disclosed herein are method embodiments for forming the above-described MOSFET embodiments.

What is claimed is:

1. A field effect transistor comprising:
    a semiconductor body comprising:
        a channel region;
        a source region adjacent to a first side of said channel region; and
        a drain region adjacent to a second side of said channel region opposite said first side;
    a gate structure on said semiconductor body, said gate structure comprising:
        a gate dielectric layer on said channel region; and,
        a gate electrode on said gate dielectric layer, said gate electrode having a first section immediately adjacent to said gate dielectric layer on said first side of said channel region and a second section immediately adjacent to said gate dielectric layer on said second side of said channel region, said second section being different from said first section and comprising a phase transition material,
        said phase transition material being insulative when a voltage difference between said drain region and said source region is above a threshold difference and when said field effect transistor is in an OFF state, and
        said phase transition material being conductive when said voltage difference between said drain region and said source region is above said threshold difference and when said field effect transistor is in an ON state; and,
    gate sidewall spacers on opposing sides of said gate structure immediately adjacent to said first section and said second section.

2. The field effect transistor of claim 1, said first section overlapping said source region and said second section overlapping said drain region.

3. The field effect transistor of claim 1, said phase transition material comprising vanadium dioxide doped with a dopant.

4. The field effect transistor of claim 3, said dopant comprising any of chromium and titanium.

5. The field effect transistor of claim 1,
    said phase transition material being insulative when a first voltage on said source region is 0 volts, a second voltage on said drain region is 1 volt, and a third voltage on said gate structure is 0 volts, and said phase transition material being conductive when said first voltage on said source region is 0 volts, said second voltage on said drain region is 1 volt, and said third voltage on said gate structure is 1 volt.

6. A method of forming a field effect transistor, said method comprising:

providing a semiconductor body; and forming a gate structure on a channel region in said semiconductor body such that said gate structure comprises:

a gate dielectric layer on said channel region; and a gate electrode having a first section immediately adjacent to said gate dielectric layer on a first side of said channel region and a second section immediately adjacent to said gate dielectric layer on a second side of said channel region, said first side of said channel region being adjacent to a source region, said second side of said channel region being adjacent to a drain region, and said second section being different from said first section and comprising a phase transition material, and said phase transition material being pre-selected so as to be insulative when a voltage difference between said drain region and said source region is above a threshold difference and when said field effect transistor is in an OFF state and further so as to be conductive when said voltage difference between said drain region and said source region is above said threshold difference and when said field effect transistor is in an ON state; and, forming gate sidewall spacers on opposing sides of said gate structure immediately adjacent to said first section and said second section.

7. The method of claim 6, said first section overlapping said source region and said second section overlapping said drain region.

8. The method of claim 6, said phase transition material comprising vanadium dioxide doped with a dopant.

9. The method of claim 8, said dopant comprising any of chromium and titanium.

10. The method of claim 6, said phase transition material being pre-selected so as to be insulative when a first voltage on said source region is 0 volts, a second voltage on said drain region is 1 volt, and a third voltage on said gate structure is 0 volts and further so as to be conductive when said first voltage on said source region is 0 volts, said second voltage on said drain region is 1 volt, and said third voltage on said gate structure is 1 volt.

* * * * *